(12) United States Patent
Kawano et al.

(10) Patent No.: US 12,341,004 B2
(45) Date of Patent: Jun. 24, 2025

(54) FILM FORMATION METHOD AND FILM FORMATION APPARATUS

(71) Applicant: Tokyo Electron Limited, Tokyo (JP)

(72) Inventors: Yumiko Kawano, Nirasaki (JP); Shuji Azumo, Nirasaki (JP); Shinichi Ike, Hwaseong-si (KR)

(73) Assignee: Tokyo Electron Limited, Tokyo (JP)

( * ) Notice: Subject to any disclaimer, the term of this patent is extended or adjusted under 35 U.S.C. 154(b) by 423 days.

(21) Appl. No.: 17/757,842

(22) PCT Filed: Dec. 21, 2020

(86) PCT No.: PCT/JP2020/047698
§ 371 (c)(1),
(2) Date: Jun. 22, 2022

(87) PCT Pub. No.: WO2021/132163
PCT Pub. Date: Jul. 1, 2021

(65) Prior Publication Data
US 2023/0037372 A1 Feb. 9, 2023

(30) Foreign Application Priority Data
Dec. 27, 2019 (JP) .................. 2019-239349

(51) Int. Cl.
*H01L 21/02* (2006.01)
*C23C 16/04* (2006.01)
(Continued)

(52) U.S. Cl.
CPC ........ *H01L 21/02271* (2013.01); *C23C 16/04* (2013.01); *C23C 16/403* (2013.01); *C23C 16/405* (2013.01); *C23C 16/448* (2013.01); *C23C 16/45525* (2013.01); *C23C 16/4583* (2013.01); *C23C 16/46* (2013.01); *H01L 21/02178* (2013.01); *H01L 21/02181* (2013.01)

(58) Field of Classification Search
None
See application file for complete search history.

(56) References Cited

U.S. PATENT DOCUMENTS

2009/0297868 A1 12/2009 Ito et al.
2015/0147487 A1 5/2015 Fuse et al.
(Continued)

FOREIGN PATENT DOCUMENTS

JP 2007-100191 A 4/2007
JP 2009-290187 A 12/2009
(Continued)

*Primary Examiner* — Hsien Ming Lee
(74) *Attorney, Agent, or Firm* — Armstrong Teasdale LLP

(57) ABSTRACT

A film formation method includes (A) to (C) below. (A) Providing a substrate including, on a surface of the substrate, a first region in which a first material is exposed and a second region in which a second material different from the first material is exposed. (B) Supplying, to the surface of the substrate, vapor of a solution that contains a raw material of a self-assembled monolayer and a solvent by which the raw material is dissolved, and selectively forming a self-assembled monolayer in the first region. (C) Forming a desired target film in the second region by using the self-assembled monolayer formed in the first region.

16 Claims, 12 Drawing Sheets

(51) Int. Cl.
    *C23C 16/40*     (2006.01)
    *C23C 16/448*     (2006.01)
    *C23C 16/455*     (2006.01)
    *C23C 16/458*     (2006.01)
    *C23C 16/46*     (2006.01)

(56) References Cited

U.S. PATENT DOCUMENTS

2017/0062210 A1*   3/2017  Visser ............... H01L 21/02068
2018/0053659 A1*   2/2018  Chakraborty ..... H01L 21/02636
2020/0020580 A1*   1/2020  Lee .................... H01L 21/0228

FOREIGN PATENT DOCUMENTS

JP       2015-101772 A     6/2015
JP       2018-512504 A     5/2018

\* cited by examiner

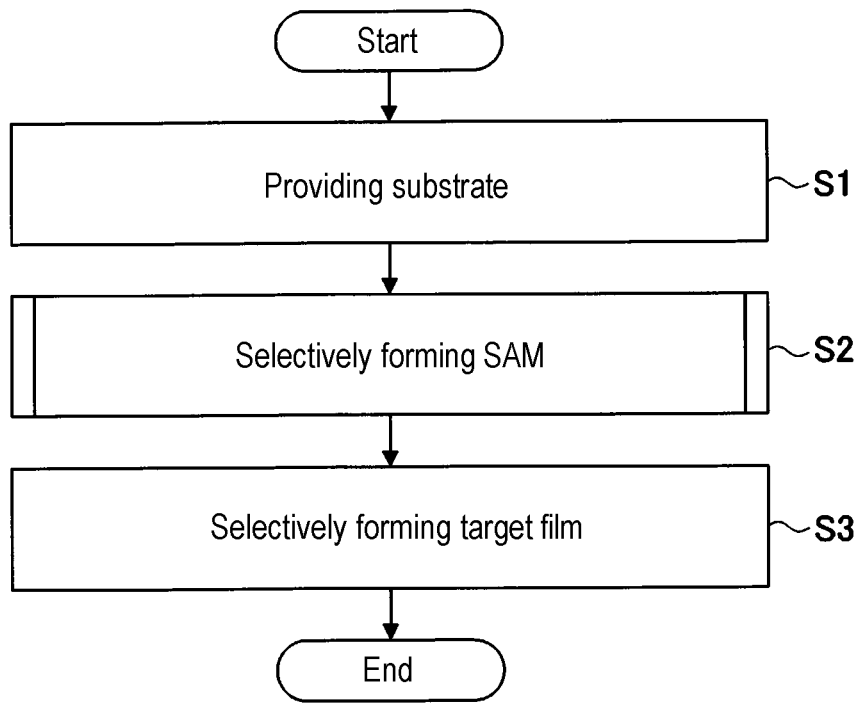
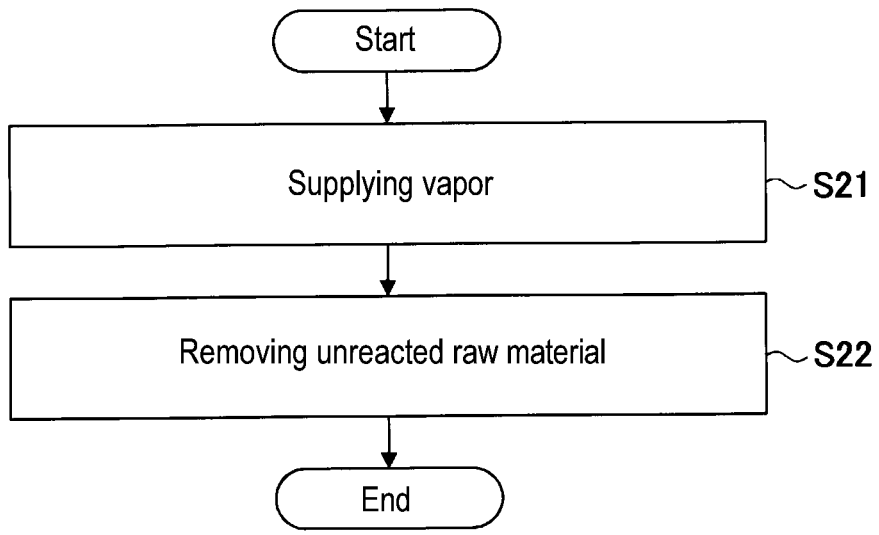

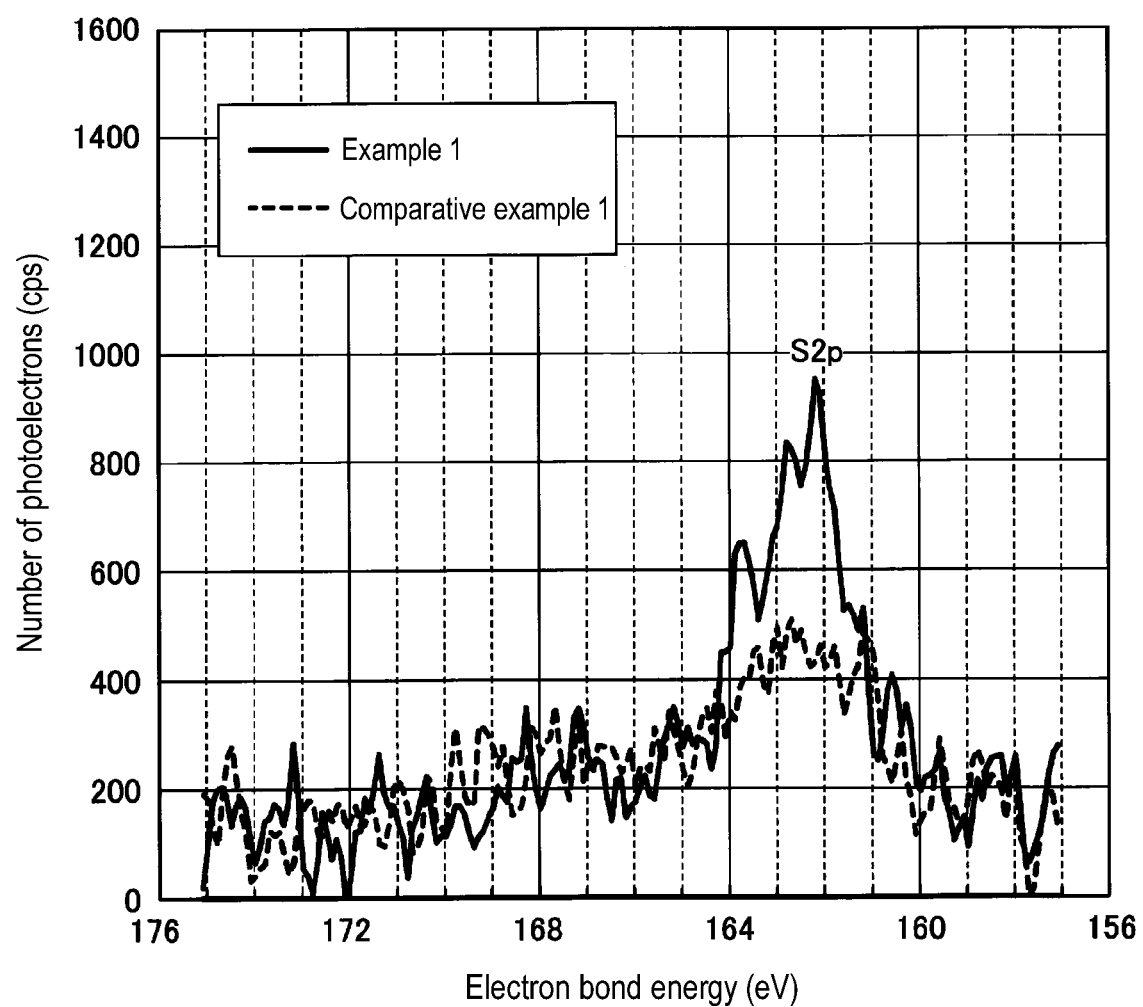

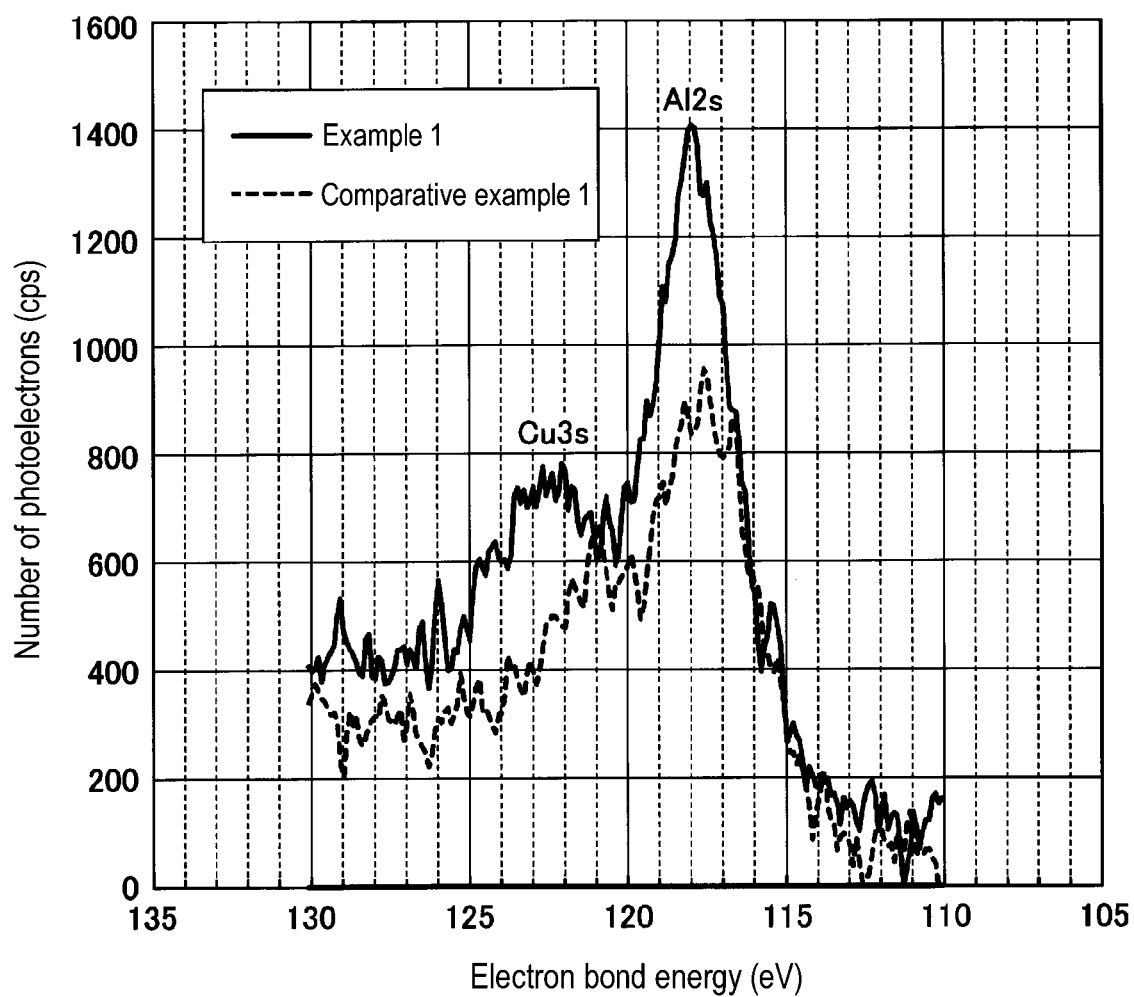

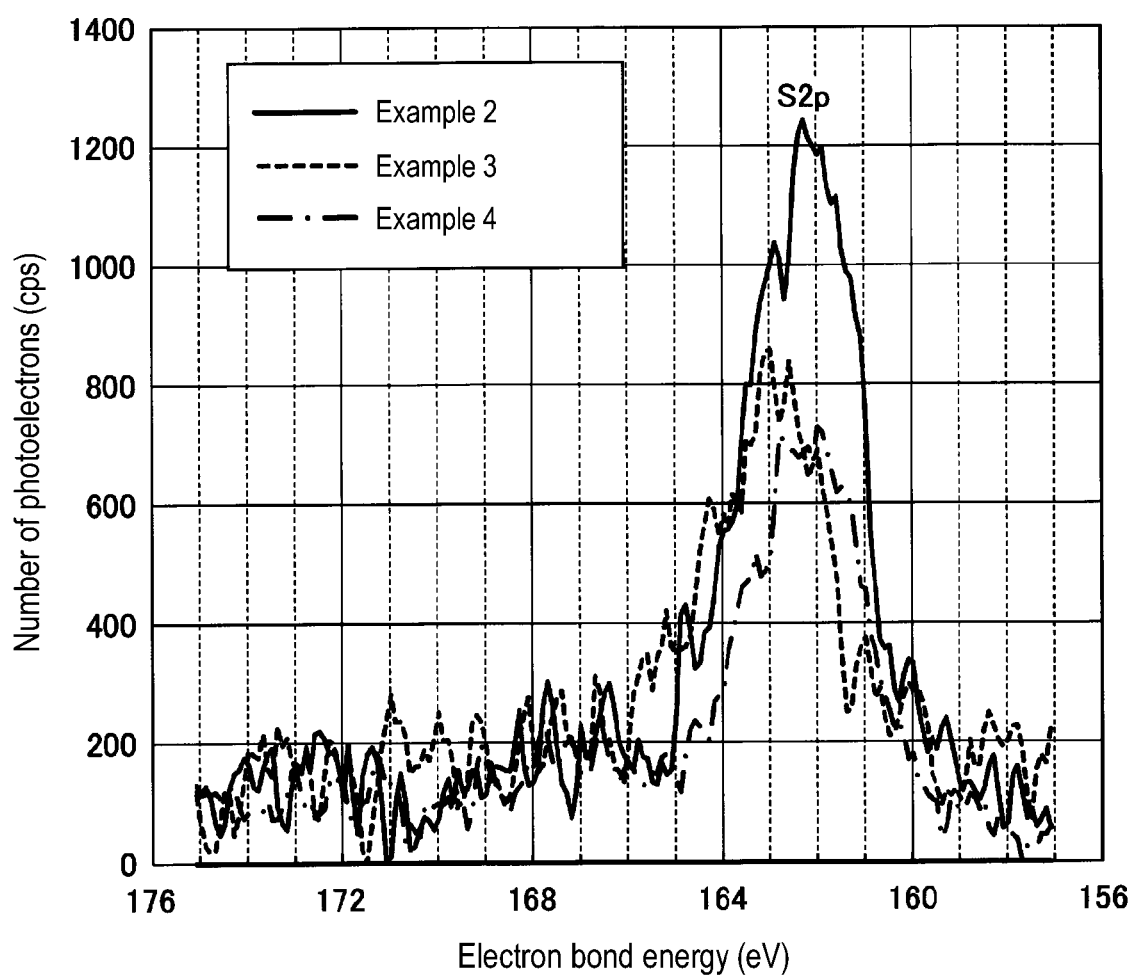

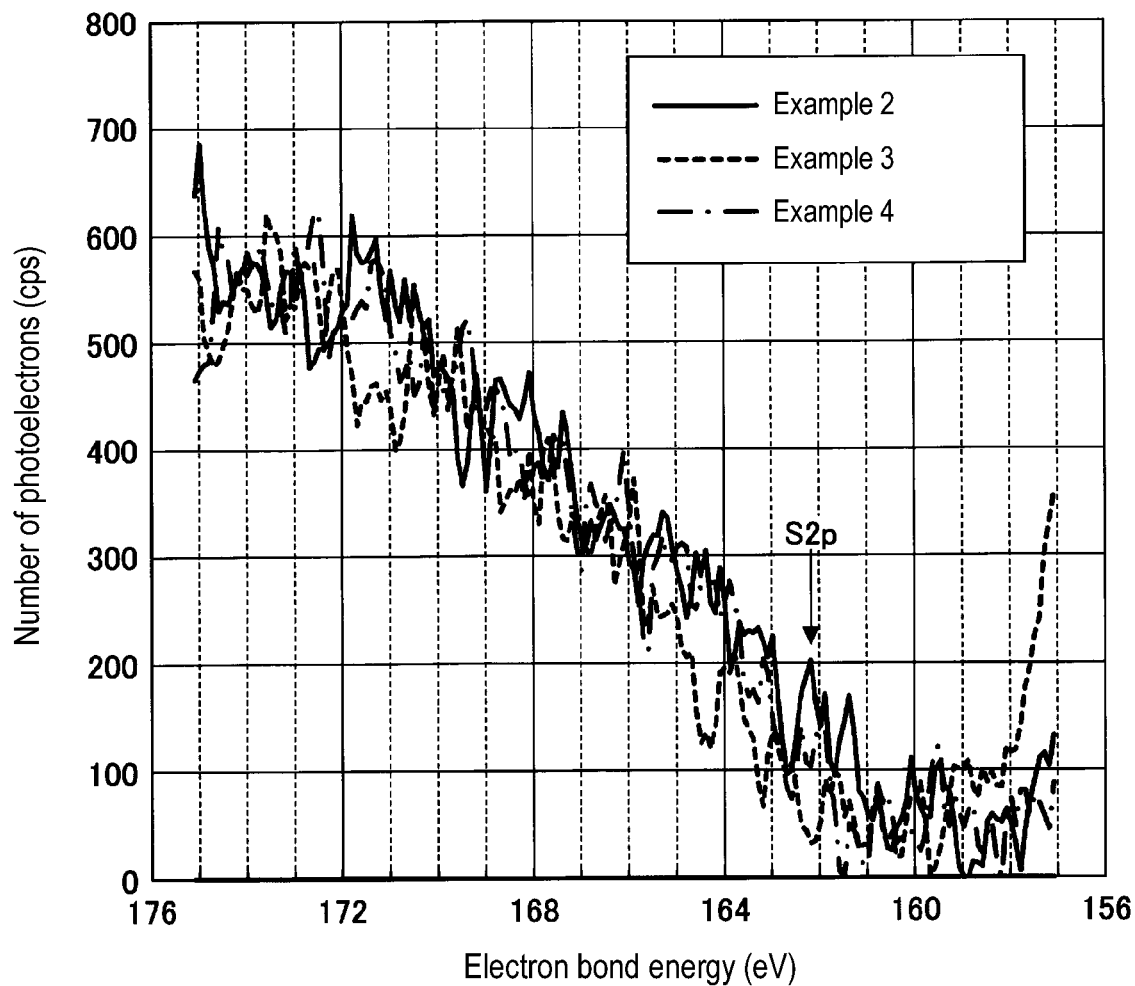

FILM FORMATION METHOD AND FILM FORMATION APPARATUS

CROSS-REFERENCE TO RELATED APPLICATIONS

The present application is a U.S. National Stage Entry of International Patent Application No. PCT/JP2020/047698, filed Dec. 21, 2020, which claims the benefit of priority to Japanese Patent Application No. 2019-239349, filed Dec. 27, 2019, each of which is hereby incorporated herein by reference in its entirety.

TECHNICAL FIELD

The present disclosure relates to a film formation method and a film formation apparatus.

BACKGROUND

Patent Documents 1 and 2 disclose a technique of forming a target film selectively in a specific area of a substrate without using a photolithography technique. Specifically, a technique is disclosed in which a self-assembled monolayer (SAM) that inhibits formation of a target film is formed in a partial region of the substrate and the target film is formed in the remaining region of the substrate.

In Patent Document 1, the substrate is immersed in a solution containing a raw material of a SAM and a solvent to form the SAM on the exposed silicon-containing surface. The raw material of the SAM is, for example, organosilane. The silicon-containing surface is, for example, a $SiO_2$ surface. The SAM suppresses the formation of a low-dielectric constant dielectric layer on the silicon-containing surface. The low-dielectric constant dielectric layer is selectively deposited on the silicon surface (Si surface).

In Patent Document 2, a solution containing a raw material of a SAM and a solvent is applied to a substrate through a spin coating method, and then the substrate surface is dried through a method of rotating the substrate or a method of spraying dry air or nitrogen gas, and a SAM is formed on the substrate surface. The raw material of the SAM is, for example, an alkylsilane compound.

PRIOR ART DOCUMENTS

Patent Documents

Patent Document 1: Japanese Laid-Open Patent Publication No. 2018-512504

Patent Document 2: Japanese Laid-Open Patent Publication No. 2009-290187

An aspect of the present disclosure provides a technique capable of improving blocking performance of a SAM when the SAM is formed by using a solution containing a raw material of the SAM and a solvent.

SUMMARY

A film formation method of an aspect of the present disclosure includes (A) to (C) below. (A) Providing a substrate including, on a surface of the substrate, a first region in which a first material is exposed and a second region in which a second material different from the first material is exposed. (B) Supplying, to the surface of the substrate, vapor of a solution that cont ains a raw material of a self-assembled monolayer and a solvent by which the raw material is di ssolved, and selectively forming a self-assembled monolayer in the first region. (C) Forming a desired target film in the second region by using the self-assembled monolayer formed in the first region.

According to an aspect of the present disclosure, it is possible to improve the blocking performance of a SAM when the SAM is formed by using a solution containing a raw material of the SAM and a solvent.

BRIEF DESCRIPTION OF DRAWINGS

FIG. 1 is a flowchart illustrating a film formation method according to an embodiment.

FIG. 2 is a flowchart illustrating an example of S2 of FIG. 1.

FIG. 11 is a view showing data obtained by measuring the surface states of the first regions immediately before formation of AlO films, with an X-ray photoelectron spectroscopy (XPS) device, for Example 1 and Comparative Example 1.

FIG. 12 is a view showing data obtained by measuring the surface states of the first regions immediately after the formation of AlO films, with the X-ray photoelectron spectroscopy (XPS) device, for Example 1 and Comparative Example 1.

FIG. 13 is a view showing data obtained by measuring the surface states of the first regions immediately after the formation of SAM films, with the X-ray photoelectron spectroscopy (XPS) device, for Examples 2 to 4.

FIG. 14 is a view showing data obtained by measuring the surface states of the second regions immediately after the formation of SAM films, with an X-ray photoelectron spectroscopy (XPS) device, for Examples 2 to 4.

DETAILED DESCRIPTION

Figure 3A:
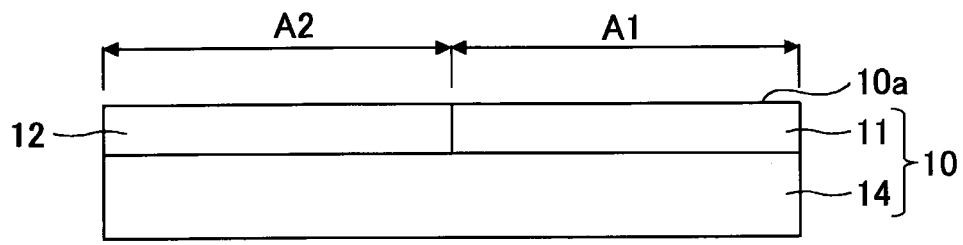
FIG. 3A is a side view illustrating an example of a substrate in S1 of FIG. 1.

Hereinafter, embodiments of the present disclosure will be described with reference to the drawings. In each drawing, the same or corresponding components may be denoted by the same reference numerals, and a description thereof may be omitted.

As illustrated in FIG. 1, the film formation method includes S1 to S3. First, in S1 of FIG. 1, a substrate 10 illustrated in FIG. 3A is provided. The substrate 10 includes, on a surface 10a thereof, a first region A1 in which a first material is exposed and a second region A2 in which a second material different from the first material is exposed.

The first region A1 and the second region A2 are provided on one side of the substrate 10 in the plate thickness direction.

The number of first regions A1 is one in FIG. 3A, but may be two or more. For example, two first regions A1 may be arranged with a second region A2 interposed therebetween. Similarly, the number of second regions A2 is one in FIG. 3A, but may be two or more. For example, two second regions A2 may be arranged with the first region A1 interposed therebetween. The first region A1 and the second region A2 are adjacent to each other, but may be spaced apart from each other.

In addition, the substrate 10 illustrated in FIG. 3A includes, on the surface 10a thereof, the first region A1 and the second region A2 only, but may further include a third region. The third region is a region in which a third material different from the first material and the second material is exposed. The third region may be arranged between the first region A1 and the second region A2, or may be arranged outside the first region A1 and the second region A2.

The first material is, for example, a metal. The metal is, for example, Cu, W, Co, or Ru. The first material is a metal in the present embodiment, but may be a semiconductor. The semiconductor is, for example, amorphous silicon or polycrystalline silicon. The semiconductor may or may not contain a dopant.

The second material is, for example, an insulating material. The insulating material is, for example, a metal compound or carbon. The metal compound is silicon oxide, silicon nitride, silicon oxynitride, silicon carbide, aluminum oxide, zirconium oxide, hafnium oxide, or the like. The insulating material may be a low-dielectric constant material (Low-k material) having a dielectric constant lower than that of $SiO_2$.

The substrate 10 includes, for example, an insulating film 12 formed of the above-mentioned insulating material and a metal film 11 formed of the above-mentioned metal. Instead of the metal film 11, a semiconductor film formed of the above-mentioned semiconductor may be formed. The substrate 10 includes a base substrate 14 on which the insulating film 12 and the metal film 11 are formed. The base substrate 14 is, for example, a semiconductor substrate such as a silicon wafer. In addition, the base substrate 14 may be a glass substrate or the like.

In addition, the substrate 10 may further include, between the base substrate 14 and the insulating film 12, a base film formed of a material different from those of the base substrate 14 and the insulating film 12. Similarly, the substrate 10 may further include, between the base substrate 14 and the metal film 11, a base film formed of a material different from those of the base substrate 14 and the metal film 11.

Figure 3B:
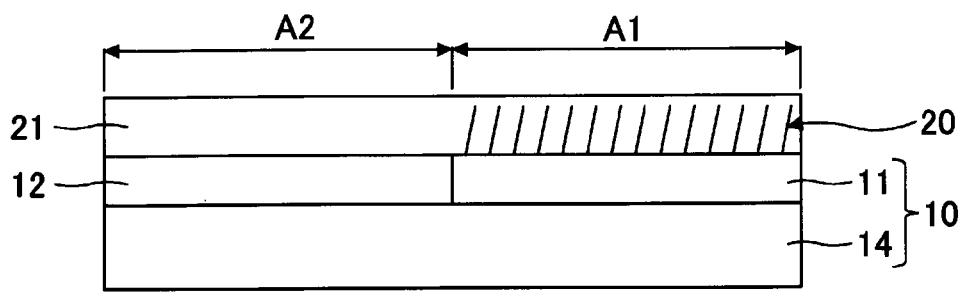
FIG. 3B is a side view illustrating an example of a substrate in S21 of FIG. 2.
Figure 3C:
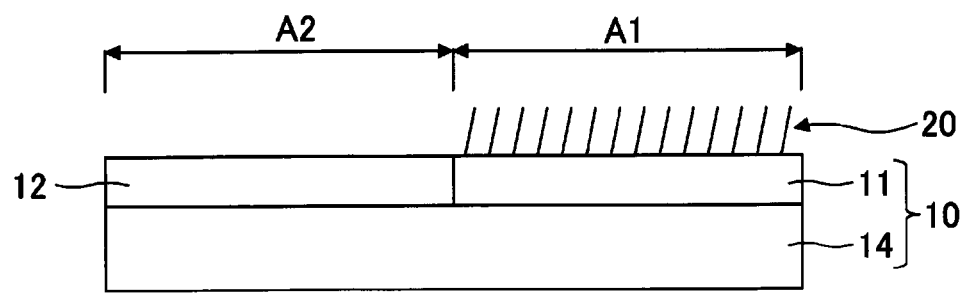
FIG. 3C is a side view illustrating an example of a substrate in S22 of FIG. 2.

Next, in S2 of FIG. 1, as illustrated in FIGS. 3B and 3C, a self-assembled monolayer (SAM) 20 is selectively formed in the first region A1, of the first region A1 and the second region A2. In a portion of the SAM 20, another monomolecular film may be mixed, or a plurality of molecular films may be formed. S2 in FIG. 1 includes, for example, S21 to S22 illustrated in FIG. 2.

First, in S21 of FIG. 2, as illustrated in FIG. 3B, the vapor of a solution containing the raw material 21 of the SAM 20 is supplied to the surface 10a of the substrate 10, and the raw material 21 is deposited on the surface 10a of the substrate 10. The raw material 21 is an organic compound, for example, a thiol-based compound.

The thiol-based compound is, for example, a compound represented by a general formula, R—SH. Here, R is an aliphatic hydrocarbon group or an aromatic hydrocarbon group, and some of hydrogen atoms may be replaced with halogen atoms. The halogen atoms include fluorine, chlorine, bromine, iodine, and the like. The thiol-based compound is, for example, $CF_3(CF_2)_x(CH_2)_2SH$ (X=0 to 17) or $CH_3(CH_2)_xSH$ (X=1 to 19).

The number of carbon atoms in the main chain of the thiol-based compound is, for example, 20 or less, preferably 10 or less. As the number of carbon atoms becomes smaller, a length of the main chain becomes shorter and a vapor pressure becomes higher. Therefore, as the number of carbon atoms becomes smaller, a supply amount of vapor are likely to increase.

The thiol-based compound is chemisorbed on the above-mentioned metal or semiconductor without being chemisorbed on the above-mentioned insulating material. For example, the thiol-based compound reacts with the above-mentioned metal or semiconductor to form an R-S-M bond. Here, M is the above-mentioned metal or semiconductor. Since the thiol-based compound reacts with the above-mentioned metal or semiconductor, the thiol-based compound is selectively chemisorbed on the first region A1 of the first region A1 and the second region A2.

The solution contains a solvent by which the raw material 21 is dissolved, in addition to the raw material of the SAM 20. The raw material 21 may be a liquid or a solid at a room temperature and pressure. The solvent is appropriately selected according to the raw material 21, and is, for example, toluene or the like. The boiling point of the solvent is, for example, 40 degrees C. to 120 degrees C. The concentration of the raw material 21 in the solution is, for example, 0.1% by volume to 10% by volume.

According to the present embodiment, unlike the conventional case, the vapor of the solution, not the solution itself, is supplied to the surface 10a of the substrate 10. Therefore, as shown in the experimental data to be described later, it is possible to improve the blocking performance of the SAM 20.

Figure 5:
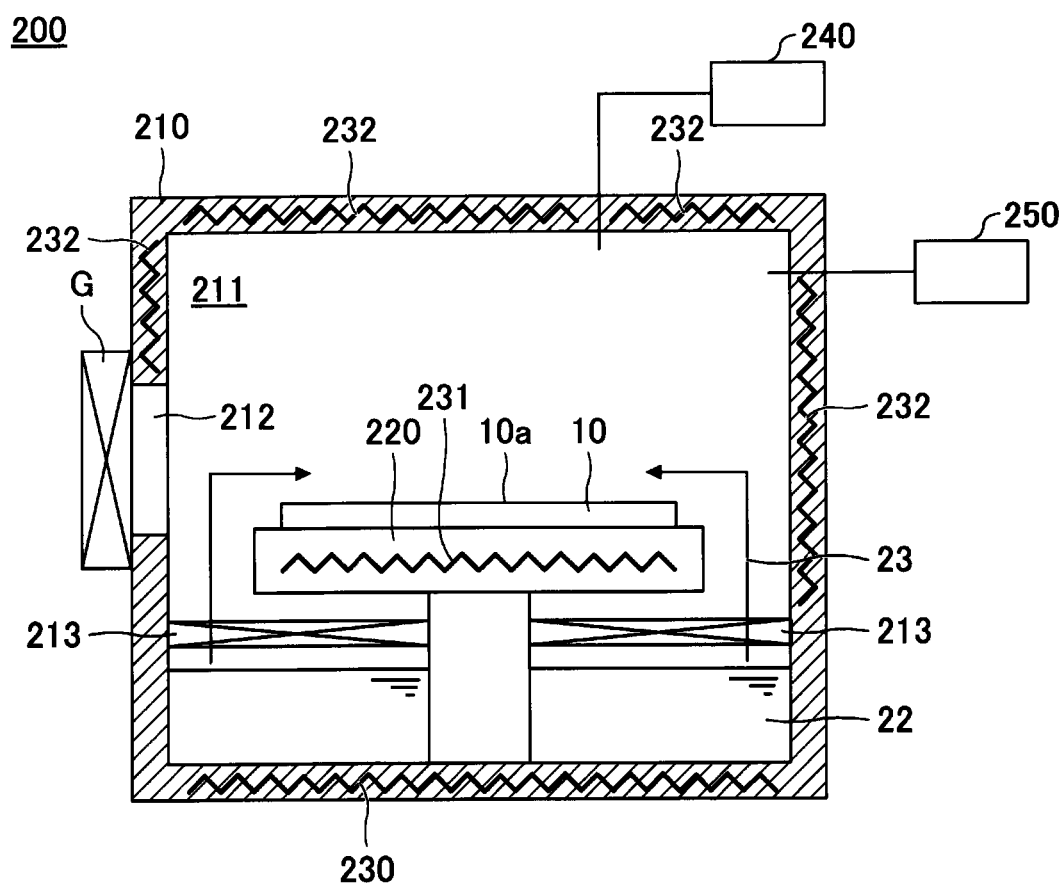
FIG. 5 is a cross-sectional view illustrating an example of a first processor of FIG. 4.

For example, in S21 of FIG. 2, as illustrated in FIG. 5, both the substrate 10 and the solution 22 may be accommodated inside a first processing container 210, and the vapor 23 of the solution 22 may be supplied to the surface 10a of the substrate 10. In this case, the substrate 10 is disposed, for example, above the liquid surface of the solution 22 not to get wet with the droplets of the solution 22.

Figure 6:
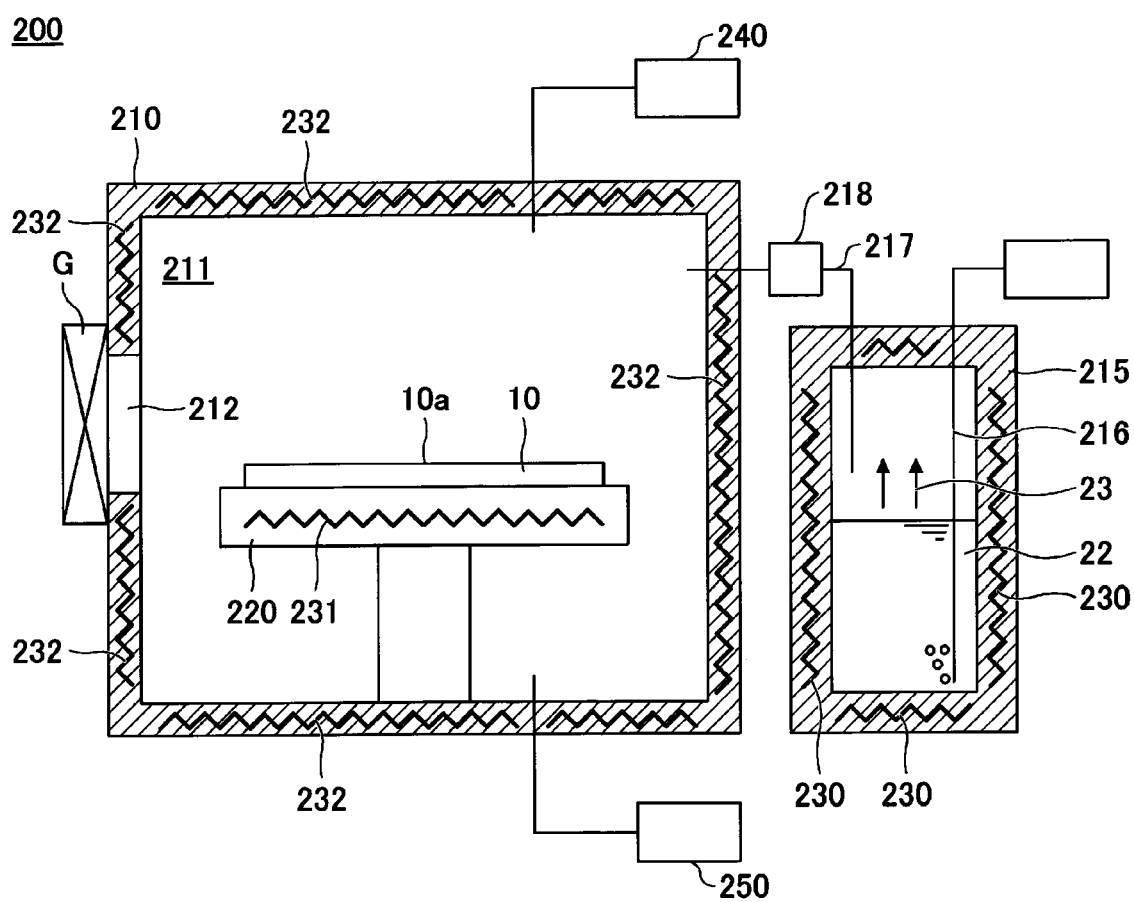
FIG. 6 is a cross-sectional view illustrating a modification of the first processor of FIG. 4.

Alternatively, in S21 of FIG. 2, as illustrated in FIG. 6, vapor 23 may be generated inside a second processing container 215 that accommodates the solution 22, and the generated vapor 23 may be sent from the second processing container 215 to the first processing container 210 that accommodates the substrate 10. Since the second processing container 215 is provided outside the first processing container 210, it is easy to control a temperature T1 of the substrate 10 and a temperature T0 of the solution 22 separately.

In addition, as illustrated in FIG. 6, the solution 22 may be bubbled inside the second processing container 215. A bubbling pipe 216 supplies an inert gas, such as nitrogen gas or argon gas, into the solution 22, and forms bubbles inside the solution 22. By the bubbling of the solution 22, the generation of the vapor 23 may be promoted.

In S21 of FIG. 2, the temperature T1 of the substrate 10 may be controlled to a temperature higher than the temperature T0 of the solution 22. Since the vapor 23 is generated at the temperature T0, the vapor 23 may be liquefied at a temperature lower than the temperature T0. When the temperature T1 of the substrate 10 is higher than the temperature T0 of the solution 22, it is possible to prevent the liquefaction of the vapor 23 on the surface 10a of the substrate 10, and thus it is possible to prevent the adhesion of droplets.

In S21 of FIG. 2, a temperature T2 of a portion of an inner wall surface of the first processing container 210 that comes into contact with the vapor 23 may be controlled to a temperature higher than the temperature T0 of the solution 22. The first processing container 210 accommodates the substrate 10. When the temperature T2 of the inner wall surface of the first processing container 210 is higher than the temperature T0 of the solution 22, it is possible to prevent the liquefaction of the vapor 23 on the inner wall surface of the first processing container 210, and thus it is possible to prevent the adhesion of droplets.

The temperature T0 of the solution 22 is, for example, 20 degrees C. to 110 degrees C. The temperature T1 of the substrate 10 is, for example, 10 degrees C. to 200 degrees C., preferably 60 degrees C. to 200 degrees C. The temperature T2 of the portion of the inner wall surface of the first processing container 210 that comes into contact with the vapor 23 is, for example, 10 degrees C. to 200 degrees C., preferably 60 degrees C. to 200 degrees C. A time duration during which the vapor 23 is supplied to the surface 10a of the substrate 10 in S21 of FIG. 2 is, for example, 60 seconds to 300 seconds.

Next, in S22 of FIG. 2, as illustrated in FIG. 3C, the raw material 21 deposited on the surface 10a of the substrate 10 and unreacted on the surface 10a is removed. The removal of the unreacted raw material 21 includes, for example, cleaning the surface 10a of the substrate 10 with a solvent that dissolves the raw material 21. The solvent may be heated to improve a detergency thereof. The heating temperature of the solvent is, for example, 65 degrees C. to 85 degrees C. Since the SAM 20 formed in the first region A1 in S21 of FIG. 2 has already been reacted, the SAM 20 is not dissolved in the solvent.

The removal of the raw material 21 may include heating the substrate 10 in a pressure-reduced atmosphere having a pressure lower than atmospheric pressure to vaporize the unreacted raw material 21, instead of cleaning the surface 10a of the substrate 10 with a solvent that dissolves the raw material 21. The heating temperature of the substrate 10 is, for example, about 100 degrees C. Since the SAM 20 formed in the first region A1 in S21 of FIG. 2 has already been reacted, the SAM 20 is not vaporized.

S2 in the present embodiment includes S21 and S22 in FIG. 2, but S2 may include S21 without including S22. For example, in S21, when the substrate 10 is heated while evacuating the interior of the first processing container 210 with a vacuum pump or the like, since the unreacted raw material 21 may be discharged to the exterior of the first processing container 210 in a vapor state and the SAM 20 may be selectively formed in the first region A1, S22 is unnecessary. However, in S21 of FIG. 2, when the interior of the first processing container 210 is not evacuated by a vacuum pump or the like, there is an advantage in that no vacuum equipment is necessary.

Figure 3D:
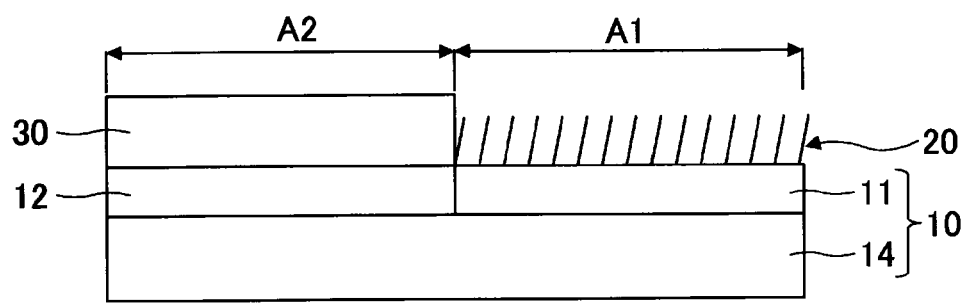
FIG. 3D is a side view illustrating an example of a substrate in S3 of FIG. 1.

Next, in S3 of FIG. 1, as illustrated in FIG. 3D, a desired target film 30 is formed in the second region A2, of the first region A1 and the second region A2, by using the SAM 20 formed in the first region A1. The target film 30 is made of a material different from that of the SAM 20. Since the SAM 20 has, for example, hydrophobicity and inhibits the formation of the target film 30, the target film 30 is selectively formed in the second region A2.

The target film 30 is formed through, for example, a chemical vapor deposition (CVD) method or an atomic layer deposition (ALD) method. The target film 30 is formed of, for example, an insulating material. The target film 30, which is an insulating film, may be further laminated on the insulating film 12, which is originally present in the second region A2. The insulating target film 30 is formed of, for example, a metal compound. The metal compound is, for example, a metal oxide or a metal oxynitride. The metal oxynitride is, for example, a silicon oxynitride.

The insulating target film 30 is not particularly limited, but is formed of, for example, an aluminum oxide. Hereinafter, the aluminum oxide is also referred to as "AlO" regardless of a composition ratio of oxygen and aluminum. When an AlO film is formed as the target film 30 through the ALD method, an Al-containing gas, such as trimethylaluminum (TMA: $(CH_3)_3Al$) gas, and an oxidizing gas, such as water vapor ($H_2O$ gas), are alternately supplied to the substrate 10. Since water vapor is not adsorbed on the hydrophobic SAM 20, AlO is selectively deposited in the second region A2. In addition to the Al-containing gas and the oxidizing gas, a modifying gas, such as hydrogen ($H_2$) gas, may be supplied to the substrate 10. These gases may be formed into plasma to promote a chemical reaction. These gases may be heated to promote the chemical reaction.

The insulating target film 30 may be formed of a hafnium oxide. Hereinafter, the hafnium oxide is also referred to as "HfO" regardless of a composition ratio of oxygen and hafnium. When an HfO film is formed as the target film 30 through the ALD method, an Hf-containing gas, such as tetrakis(dimethylamido)hafnium (TDMAH: $Hf[N(CH_3)_2]_4$) gas, and an oxidizing gas, such as water vapor ($H_2O$ gas), are alternately supplied to the substrate 10. Since the water vapor is not adsorbed on the hydrophobic SAM 20, HfO is selectively deposited in the second region A2. In addition to the Hf-containing gas and the oxidizing gas, a modifying gas such as hydrogen ($H_2$) gas may be supplied to the substrate 10. These gases may be may be formed into plasma to promote a chemical reaction. These gases may be heated to promote the chemical reaction.

The insulating target film 30 may be formed of a vanadium nitride. Hereinafter, the vanadium nitride is also referred to as "VN" regardless of a composition ratio of nitrogen and vanadium. When a VN film is formed as the target film 30 through the ALD method, a V-containing gas, such as tetrakis(ethylmethylamino)vanadium ($V[(CH_3)C_2H_5]_4$) gas, and a nitriding gas, such as an ammonia gas ($NH_3$ gas), are alternately supplied to the substrate 10. The VN is selectively deposited in the second region A2. In addition to the V-containing gas and the nitriding gas, a modifying gas, such as hydrogen ($H_2$) gas may be supplied to the substrate 10. These gases may be formed into plasma to promote a chemical reaction. These gases may be heated to promote the chemical reaction.

In the above-described embodiments, the first material of the first region A1 is a metal or a semiconductor, the second material of the second region A2 is an insulating material, and the raw material 21 of the SAM 20 is a thiol-based compound. However, the technique of the present disclosure is not limited to this combination. For example, the first material of the first region A1 may be an insulating material, the second material of the second region A2 may be a metal or a semiconductor, and the raw material 21 of the SAM 20 may be a silane-based compound.

The silane-based compound is, for example, a compound represented by the general formula R—$SiH_{3-x}Cl_x$ (x=1, 2, 3)

or a compound represented by R'—Si(O—R)$_3$ (silane coupling agent). Here, R and R' are functional groups such as an alkyl group or a group obtained by substituting at least some of hydrogen atoms of the alkyl group with fluorine atoms. The terminal group of the functional group may be either CH-based or CF-based. In addition, O—R is a hydrolysable functional group, such as a methoxy group or an ethoxy group. An example of the silane coupling agent includes octamethyltrimethoxysilane (OTS).

A silane-based compound is more likely to be chemisorbed on a surface with OH groups, so the silane-based compound is more likely to be chemisorbed on a metal compound or carbon than a metal or a semiconductor. Therefore, the silane-based compound is selectively chemisorbed in the first region A1, of the first region A1 and the second region A2. As a result, the SAM 20 is selectively formed in the first region A1.

When the raw material of SAM 20 is a silane-based compound, the target film 30 is formed of, for example, a conductive material. The conductive target film 30 may be further laminated on the conductive metal film originally existing in the second region A2. The conductive target film 30 is formed of, for example, a metal, a metal compound, or a semiconductor containing a dopant.

As described above, a semiconductor film instead of the metal film may originally exist in the second region A2, and the semiconductor film may contain a dopant and may have conductivity. The conductive target film 30 may be laminated on the conductive semiconductor film.

The conductive target film 30 is not particularly limited, but is formed of, for example, a titanium nitride. Hereinafter, the titanium nitride is also referred to as "TiN" regardless of a composition ratio of nitrogen and titanium. When the TiN film is formed as the target film 30 through the ALD method, a Ti-containing gas, such as tetrakis(dimethylamino)titanium (TDMA: Ti[N(CH$_3$)$_2$]4) gas or titanium tetrachloride (TiCl$_4$) gas, and a nitriding gas, such as ammonia (NH$_3$) gas, are alternately supplied to the substrate 10. In addition to the Ti-containing gas and the nitriding gas, a modifying gas, such as hydrogen (H$_2$) gas may be supplied to the substrate 10. These gases may be formed into plasma to promote a chemical reaction. These gases may be heated to promote the chemical reaction.

The film formation method may further include a process other than the processes illustrated in FIG. 1. For example, in the film formation method, foreign matter adhering to the surface 10a of the substrate 10 may be removed with a cleaning liquid as preprocess before S1 in FIG. 1. As a cleaning liquid that removes an organic substance, for example, an aqueous solution of hydrogen peroxide (H$_2$O$_2$) is used. As a cleaning liquid that removes cupric benzotriazole (C$_6$H$_4$N$_3$)$_2$Cu) formed by an antioxidant added to slurry through chemical mechanical polishing (CMP) performed before S1 in FIG. 1 and a native oxide film on a surface of a metal film 11 (or a semiconductor film), an aqueous solution of formic acid (HCOOH), citric acid (C(OH)(CH$_2$COOH)$_2$COOH), or the like is used. The substrate 10 is cleaned with a cleaning liquid, dried, and provided to S2.

Figure 4:
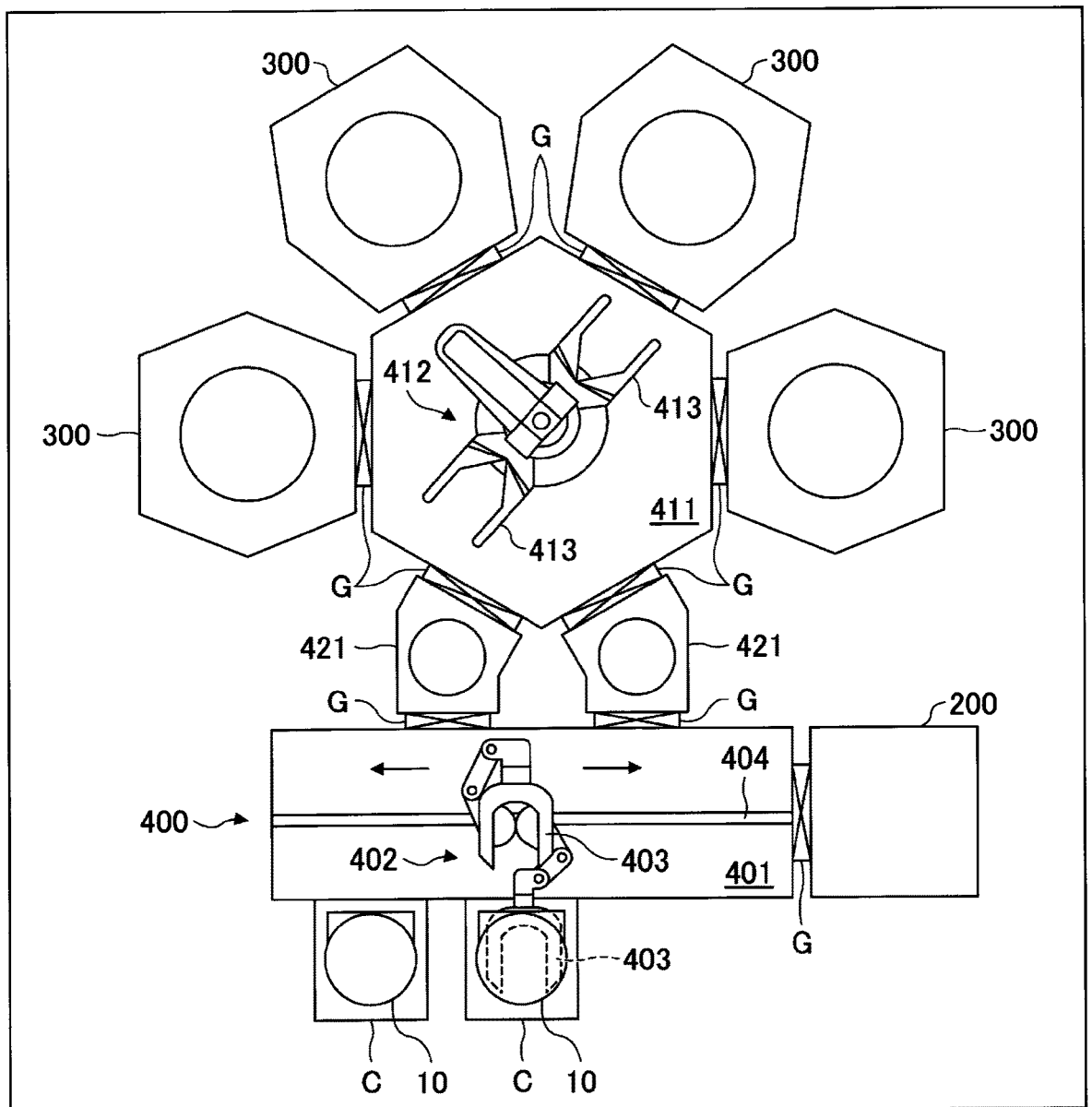
FIG. 4 is a plan view illustrating a film formation apparatus according to an embodiment.

Next, with reference to FIG. 4, a film formation apparatus 100 that executes the above-described film formation method will be described. As illustrated in FIG. 4, the film formation apparatus 100 includes a first processor 200, a second processor 300, a transporter 400, and a controller 500. The first processor 200 selectively forms the SAM 20 in the first region A1, of the first region A1 and the second region A2. The second processor 300 selectively forms a desired target film 30 in the second region A2 by using the SAM 20 formed by the first processor 200. The transporter 400 transports the substrate 10 with respect to the first processor 200 and the second processor 300. The controller 500 controls the first processor 200, the second processor 300, and the transporter 400.

The transporter 400 includes a first transport chamber 401 and a first transport mechanism 402. An internal atmosphere of the first transport chamber 401 is an air atmosphere. The first transport mechanism 402 is provided inside the first transport chamber 401. The first transport mechanism 402 includes an arm 403 that holds the substrate 10 and travels along the rail 404. The rail 404 extends in an arrangement direction of a carrier C. The first processor 200 is connected to the first transport chamber 401 via a gate valve G. The gate valve G opens/closes a transport path of a substrate 10. The gate valve G basically blocks the transport path, and opens the transport path only when the substrate 10 passes through the gate valve G.

The transporter 400 includes a second transport chamber 411 and a second transport mechanism 412. The internal atmosphere of the second transport chamber 411 is a vacuum atmosphere. The second transport mechanism 412 is provided inside the second transport chamber 411. The second transport mechanism 412 includes an arm 413 that holds the substrate 10, and the arm 413 is disposed to be movable in the vertical direction and the horizontal direction and to be rotatable around the vertical axis. The second processor 300 is connected to the second transport chamber 411 via a gate valve G.

The transporter 400 includes load-lock chambers 421 between the first transport chamber 401 and the second transport chamber 411. The internal atmosphere of the load-lock chambers 421 is switched between a vacuum atmosphere and an air atmosphere. As a result, the interior of the second transport chamber 411 may always be maintained in the vacuum atmosphere. In addition, it is possible to suppress an inflow of gas from the first transport chamber 401 to the second transport chamber 411. Gate valves G are provided between the first transport chamber 401 and the load-lock chamber 421, and between the second transport chamber 411 and the load-lock chamber 421.

The controller 500 is, for example, a computer, and includes a central processing unit (CPU) 501 and a non-transient computer readable storage medium 502 such as a memory. The storage medium 502 stores programs that control various processes executed by the film formation apparatus 100. The controller 500 controls an operation of the film formation apparatus 100 by causing the CPU 501 to execute the programs stored in the storage medium 502.

Next, the operation of the film formation apparatus 100 will be described. First, the first transport mechanism 402 takes out the substrate 10 from the carrier C and transports the taken-out substrate 10 to the first processor 200. The first processor 200 executes S21 and S22 of FIG. 2. That is, the first processor 200 selectively forms a SAM 20 in the first region A1, of the first region A1 and the second region A2.

Next, the first transport mechanism 402 takes out the substrate 10 from the first processor 200, and transports the substrate 10 from the first transport chamber 401. Thereafter, the first transport mechanism 402 transports the substrate 10 to a load-lock chamber 421 and exits from the load-lock chamber 421.

Next, the internal atmosphere of the load-lock chamber 421 is switched from the air atmosphere to the vacuum atmosphere. Thereafter, the second transport mechanism 412 takes out the substrate 10 from the load-lock chamber 421 and transports the taken-out substrate 10 to the second processor 300.

Next, the second processor 300 executes S3 in FIG. 1. That is, the second processor 300 selectively forms a desired target film 30 in the second region A2 by using the SAM 20 formed by the first processor 200.

Next, the second transport mechanism 412 takes out the substrate 10 from the second processor 300, transports the taken-out substrate 10 to the load-lock chamber 421, and exits from the load-lock chamber 421. Subsequently, the internal atmosphere of the load-lock chamber 421 is switched from the vacuum atmosphere to the air atmosphere. Thereafter, the first transport mechanism 402 takes out the substrate 10 from the load-lock chamber 421 and accommodates the taken-out substrate 10 in the carrier C.

The configuration of the film formation apparatus 100 is not limited to the configuration illustrated in FIG. 4. For example, the first processor 200 may not be installed adjacent to the first transport chamber 401, but may be separately provided as an apparatus. In the latter case, the substrate 10 is processed by the first processor 200, then accommodated in the carrier C, and then transported from the carrier C to the load-lock chamber 421.

In addition, an inert gas may be supplied into the transporter 400 and the first processor 200 to turn the internal atmospheres thereof into inert atmospheres. After the SAM 20 is formed in the inert atmosphere by using the first processor 200, the target film 30 may be formed by the second processor 300 without exposing the SAM 20 to the air. It is possible to suppress deterioration of the SAM 20, and to selectively form the target film 30 in the second region A2.

Next, the first processor 200 will be described with reference to FIG. 5. The first processor 200 includes a first processing container 210, a substrate holder 220, a first temperature regulator 230, a second temperature regulator 231, a third temperature regulator 232, a gas supplier 240, and a gas discharger 250. The first processing container 210 accommodates both the substrate 10 and the solution 22. The substrate holder 220 holds the substrate 10 inside the first processing container 210. The first temperature regulator 230 regulates the temperature of the solution 22. The second temperature regulator 231 regulates the temperature of the substrate 10. The third temperature regulator 232 regulates a temperature of a portion of the inner wall surface of the first processing container 210 to be in contact with vapor 23. The gas supplier 240 supplies a gas, such as an inert gas, into the first processing container 210. The gas discharger 250 discharges gas from the interior of the first processing container 210.

The first processing container 210 includes a loading/unloading port 212 of the substrate 10. The loading/unloading port 212 is disposed at a position higher than a liquid level of the solution 22. The loading/unloading port 212 is provided with a gas valve G that opens/closes the loading/unloading port 212. The gate valve G basically closes the loading/unloading port 212, and opens the loading/unloading port 212 when the substrate 10 passes through the loading/unloading port 212. When the loading/unloading port 212 is opened, the processing chamber 211 inside the first processing container 210 and the first transport chamber 401 communicate with each other.

The first processing container 210 may include a switch 213 that opens/closes a passage of the vapor 23. When the switch 213 opens the passage, the vapor 23 flows from the liquid level of the solution 22 toward the substrate 10, and the vapor is supplied to the surface 10a of the substrate 10. When the switch 213 closes the passage, the supplying of vapor 23 to the substrate 10 is interrupted. When the switch 213 closes the passage of the vapor 23 at the time of loading/unloading the substrate 10 with respect to the first processing container 210 and an inert gas, such as Ar or $N_2$, is supplied from the gas supplier 240 while the vapor 23 is exhausted by using the gas discharger 250, it is possible to suppress the exposure of the arm 403 of the first transport mechanism 402 to the vapor 23.

The substrate holder 220 holds the substrate 10 inside the first processing container 210. The substrate 10 is disposed above the liquid level of the solution 22 so as not to get wet with the solution 22. The substrate holder 220 holds the substrate 10 horizontally from below such that the surface 10a of the substrate 10 faces upward. The substrate holder 220 is of a single-wafer type and holds one substrate 10. The substrate holder 220 may be of a batch type, or may hold a plurality of substrates 10 at the same time. The batch-type substrate holder 220 may hold a plurality of substrates 10 at intervals in the vertical direction or at intervals in the horizontal direction.

The first temperature regulator 230, the second temperature regulator 231, and the third temperature regulator 232 each include, for example, an electric heater, and are independently controlled. The first temperature regulator 230 is embedded in, for example, the bottom wall or the like of the first processing container 210, and heats the bottom wall such that the solution 22 is heated to a desired temperature. In addition, the second temperature regulator 231 is embedded in, for example, the substrate holder 220, and heats the substrate holder 220 such that the substrate 10 is heated to a desired temperature. Furthermore, the third temperature regulator 232 is embedded in the side wall and the ceiling of the first processing container 210, and heats the side wall and the ceiling such that the portions in the inner wall surfaces of the side wall and the ceiling to be in contact with the vapor 23 are heated to a desired temperature.

The first temperature regulator 230, the second temperature regulator 231, and the third temperature regulator 232 are not limited to the arrangement illustrated in FIG. 5. For example, the first temperature regulator 230 may be immersed into the solution 22. The second temperature regulator 231 may include a lamp configured to heat the substrate holder 220 through a quartz window. The third temperature regulator 232 may be installed outside the first processing container 210.

The gas supplier 240 and the gas discharger 250 regulate the atmosphere inside the first processing container 210 at the time of loading/unloading the substrate 10, and lower a concentration of the vapor 23 compared with that at the time of deposition of the raw material 21. The arm 403 of the first transport mechanism 402 may be suppressed from being exposed to the vapor 23.

The first processor 200 executes S21 in FIG. 2 by supplying the vapor 23 of the solution 22 to the surface 10a of the substrate 10. In addition, the first processor 200 executes S22 in FIG. 2 by turning an ambient atmosphere of the substrate 10 into a pressure-reduced atmosphere by the gas discharger 250 and heating the substrate 10 with the second temperature regulator 231.

The first processor 200 may further include a nozzle (not illustrated) to execute S22 in FIG. 2. The nozzle ejects a solvent that dissolves the raw material 21 toward the surface 10a of the substrate 10. The same applies to the first processor 200 illustrated in FIG. 6 to be described later.

Next, a modification of the first processor 200 will be described with reference to FIG. 6. The first processor 200 includes a first processing container 210, a second processing container 215, a substrate holder 220, a first temperature regulator 230, a second temperature regulator 231, a third temperature regulator 232, a gas supplier 240, and a gas discharger 250. The first processing container 210 accommodates a substrate 10, and the second processing container 215 accommodates a solution 22. Hereinafter, differences between the first processor 200 of the present modification and the first processor 200 of FIG. 5 will be mainly described.

The second processing container 215 is disposed outside the first processing container 210. Therefore, it is easy to control the temperature T1 of the substrate 10 and the temperature T0 of the solution 22 separately. In addition, it is easy to control the temperature T2 of the inner wall surface of the first processing container 210 and the temperature T0 of the solution 22 separately. The first temperature regulator 230 is provided in, for example, the bottom wall, the side wall, and the ceiling of the second processing container 215, and heats the bottom wall, the side wall, and the ceiling such that the solution 22 is heated to a desired temperature. The first temperature regulator 230 may be immersed in the solution 22.

The first processor 200 may further include a bubbling pipe 216. The bubbling pipe 216 supplies an inert gas, such as nitrogen gas or argon gas, into the solution 22, and forms bubbles inside the solution 22. By the bubbling of the solution 22, the generation of the vapor 23 may be promoted. The vapor 23 is sent from the second processing container 215 to the first processing container 210 via the pipe 217. An opening/closing valve 218 may be provided in the middle of the pipe 217.

Figure 7:
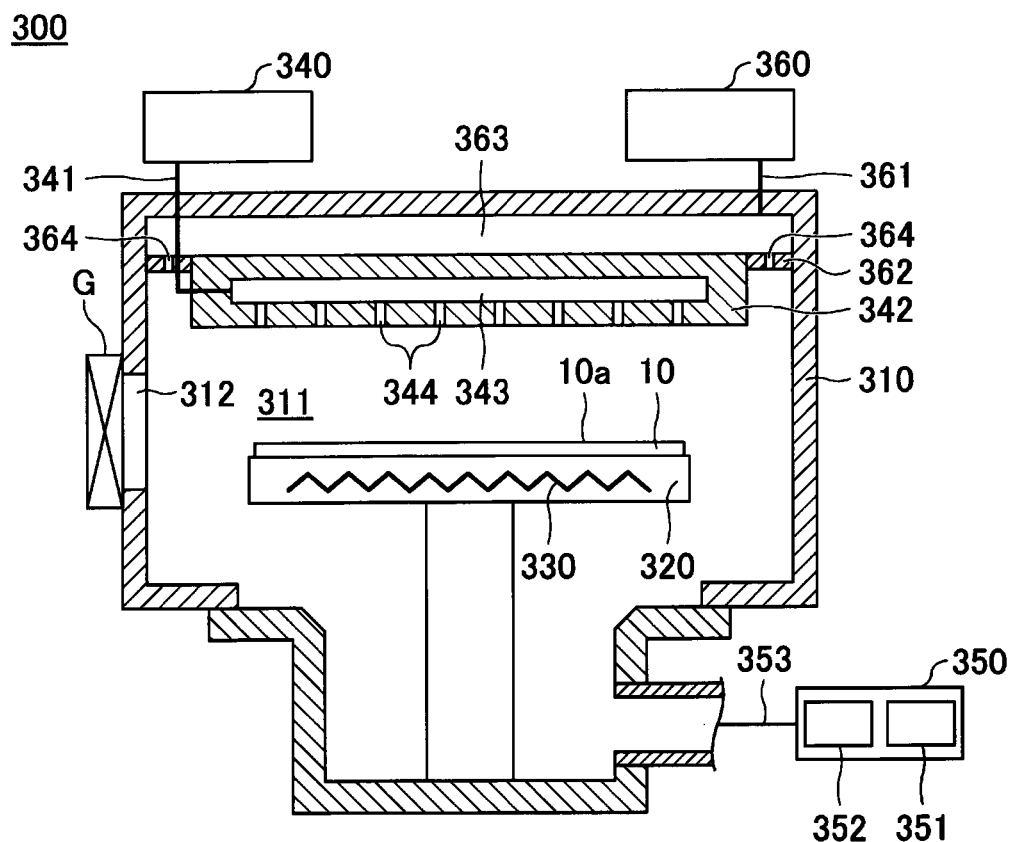
FIG. 7 is a cross-sectional view illustrating an example of a second processor of FIG. 4.

Next, the second processor 300 will be described with reference to FIG. 7. The second processor 300 includes a processing container 310, a substrate holder 320, a temperature regulator 330, a gas supplier 340, and a gas discharger 350. The processing container 310 accommodates the substrate 10. The substrate holder 320 holds the substrates 10 inside the processing container 310. The temperature regulator 330 regulates the temperature of the substrate 10. The gas supplier 340 supplies gas into the processing container 310. The gas includes a gas used in CVD or ALD. The gas discharger 350 discharges the gas from the interior of the processing container 310.

The processing container 310 includes a loading/unloading port 312 of the substrate 10. The loading/unloading port 312 is provided with a gas valve G that opens/closes the loading/unloading port 312. The gate valve G basically closes the loading/unloading port 312, and opens the loading/unloading port 312 when the substrate 10 passes through the loading/unloading port 312. When the loading/unloading port 312 is opened, the processing chamber 311 inside the first processing container 310 and the second transport chamber 411 communicate with each other.

The substrate holder 320 holds the substrate 10 inside the processing container 310. The substrate holder 320 holds the substrate 10 horizontally from below such that the surface 10a of the substrate 10 faces upward. The substrate holder 320 is of a single-wafer type and holds one substrate 10. The substrate holder 320 may be of a batch type, or may hold a plurality of substrates 10 at the same time. The batch-type substrate holder 320 may hold a plurality of substrates 10 at intervals in the vertical direction or at intervals in the horizontal direction.

The temperature regulator 330 regulates the temperature of the substrate 10. The temperature regulator 330 includes, for example, an electric heater. The temperature regulator 330 is embedded in, for example, the substrate holder 320 and heats the substrate holder 320 such that the substrate 10 is heated to a desired temperature. The temperature regulator 330 may include a lamp configured to heat the substrate holder 320 through a quartz window. In this case, an inert gas, such as argon gas, may be supplied to a space between the substrate holder 320 and the quartz window to prevent the quartz window from becoming opaque due to deposits. The temperature regulator 330 may be installed outside the processing container 310 and may regulate the temperature of the substrate 10 from the exterior of the processing container 310.

The gas supplier 340 supplies a preset gas to the substrate 10. The gas supplier 340 is connected to the processing container 310 via, for example, a gas supply pipe 341. The gas supplier 340 includes gas sources, an individual pipe individually extending from each source to the gas supply pipe 341, an opening/closing valve provided in the middle of the individual pipe, and a flow rate controller provided in the middle of the individual pipe. When the opening/closing valve opens the individual pipe, a gas is supplied from the source thereof to the gas supply pipe 341. A supply amount of the gas is controlled by the flow rate controller. Meanwhile, when the opening/closing valve closes the individual pipe, the supplying of the gas from the source thereof to the gas supply pipe 341 is stopped.

The gas supply pipe 341 supplies the gas supplied from the gas supplier 340 into the processing container 310. The gas supply pipe 341 supplies the gas supplied from the gas supplier 340 to, for example, a shower head 342. The shower head 342 is provided above the substrate holder 320. The shower head 342 includes a space 343 therein, and ejects the gas stored in the space 343 vertically downward from a large number of gas ejection holes 344. A shower-like gas is supplied to the substrate 10.

The second processor 300 may further include a gas supplier 360 in addition to the gas supplier 340. The gas supplier 340 supplies an organometallic gas such as TMA to the processing chamber 311 via the shower head 342. The gas supplier 360 supplies an oxidizing gas, such as $H_2O$, $O_2$, or $O_3$, to the processing chamber 311 via the shower head 362. The two shower heads 342 and 362 are provided separately. Therefore, mixing of the organometallic gas and the oxidizing gas in these spaces 343 and 363 may be suppressed, and generation of particles in these spaces 343 and 363 may be suppressed. The gas supplier 360 supplies the oxidizing gas to the shower head 362 via the gas supply pipe 361. The oxidizing gas is supplied from the space 363 inside the shower head 362 to the processing chamber 311 through the gas ejection holes 364.

The gas discharger 350 discharges the gas from the interior of the processing container 310. The gas discharger 350 is connected to the processing container 310 via an exhaust pipe 353. The gas discharger 350 includes an exhaust source 351, such as a vacuum pump, and a pressure controller 352. When the exhaust source 351 is operated, gas is discharged from the interior of the processing container 310. The gas pressure inside the processing container 310 is controlled by the pressure controller 352.

Example 1 and Comparative Example 1

In Example 1, the vapor of the solution 22 was supplied to the surface 10a of the substrate 10, whereas in Comparative Example 1, the solution 22 was applied to the surface 10a of the substrate 10 through a spin coating method. The details will be described below.

Example 1

First, in S1 of FIG. 1, as the substrate 10, a substrate including, on a surface 10a thereof, a first region A1 in which Cu is exposed and a second region A2 in which SiOC is exposed was provided. As a preprocess for the selective film formation of a SAM 20, the surface 10a of the substrate 10 was cleaned with an aqueous solution of citric acid at 60 degrees C. for 5 minutes. In addition, as the solution 22, a solution containing 1% by volume of $CH_3(CH_2)_5SH$ as the raw material 21 and 99% by volume of toluene as the solvent was provided.

Figure 8:
FIG. 8 is an SEM photograph showing a surface state of the substrate immediately after S21 of Example 1.

Next, in S21 of FIG. 2, both the substrate 10 and the solution 22 were accommodated inside the container, and the substrate 10 was disposed above the liquid level of the solution 22. In that state, the entire container was uniformly heated from the exterior with the heaters. The heating temperature was 85 degrees C., and the heating time was 5 minutes (300 seconds). As a result, the vapor 23 of the solution 22 was supplied to the surface 10a of the substrate 10. Thereafter, when the surface 10a of the substrate 10 was observed with a scanning electron microscope (SEM), as shown in FIG. 8, deposition of the raw material 21 of the SAM 20 was observed in both the first region A1 and the second region A2.

Figure 9:
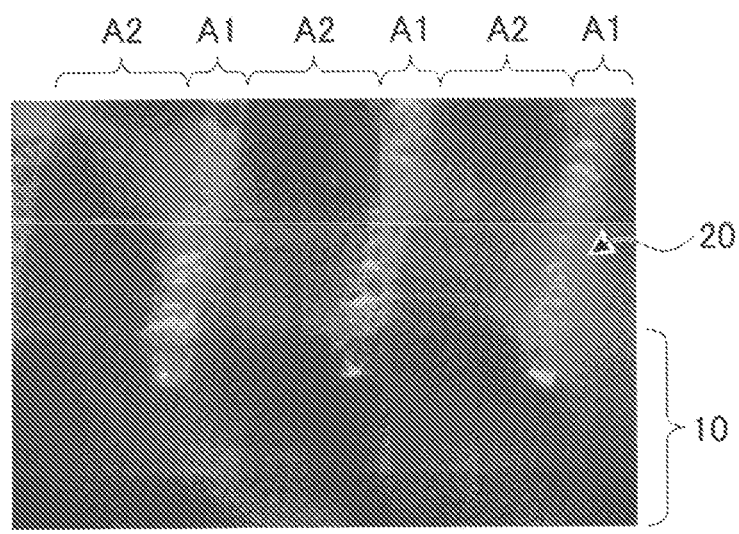
FIG. 9 is an SEM photograph showing the surface state of the substrate immediately after S22 of Example 1.

Next, in S22 of FIG. 2, the substrate 10 was cleaned with toluene at 65 degrees C., and the raw material 21 deposited on the surface 10a of the substrate 10 and unreacted on the surface 10a was removed. Thereafter, when the surface 10a of the substrate 10 was observed with the scanning electron microscope (SEM), it was confirmed that the SAM 20 was selectively formed in the first region A1 as shown in FIG. 9. It is presumed that the reason why the SAM 20 was not removed by toluene is that $CH_3(CH_2)_5SH$ as the raw material 21 reacted with Cu to form a bond of $CH_3(CH_2)_5S$—Cu.

Figure 10:
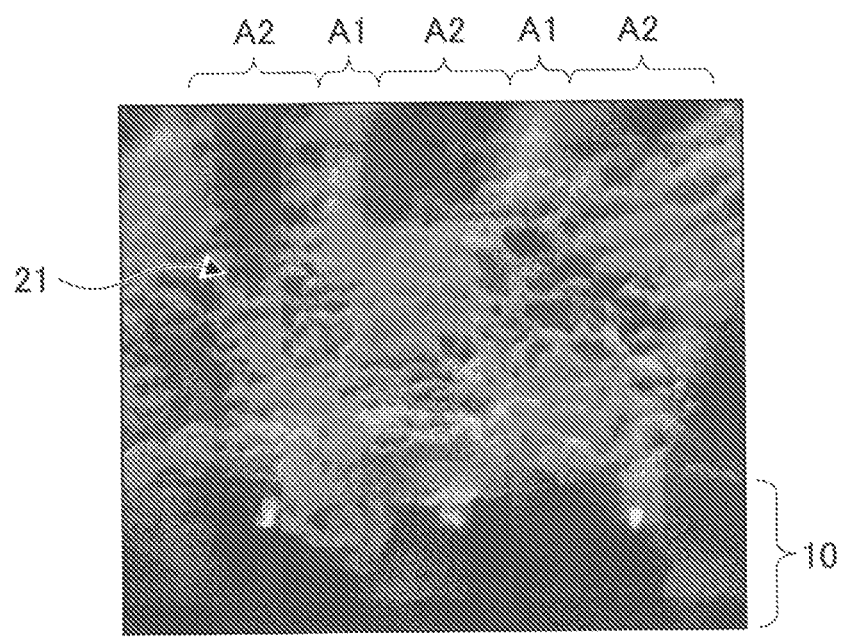
FIG. 10 is an SEM photograph showing the surface state of the substrate immediately after S22 of a reference example.

When the substrate 10 was cleaned with toluene at room temperature instead of being cleaned with toluene at 65 degrees C., the unreacted raw material 21 remained in the second region A2 and the like, as shown in FIG. 10. Therefore, it can be seen that it is preferable to heat the solvent to 65 degrees C. or higher to remove the unreacted raw material 21.

Finally, in S3 of FIG. 1, an AlO film was deposited on the surface 10a of the substrate 10 through the ALD method. Specifically, while the substrate 10 was accommodated inside the processing container 310 illustrated in FIG. 7, the air pressure inside the processing container 310 was controlled to 400 Pa, and the temperature of the substrate 10 was controlled to 150 degrees C., alternately supplying TMA gas and water vapor to the surface 10a of the substrate 10 was repeated 30 times. Thereafter, when the surface 10a of the substrate 10 was observed with the scanning electron microscope (SEM), it was confirmed that an AlO film was selectively formed in the second region A2. A thickness of the AlO film was 3 nm.

Comparative Example 1

In Comparative Example 1, a film formation process of a SAM 20 and a film formation process of an AlO film were executed in the same manner as Example 1, except that the solution 22 was applied to the surface 10a of the substrate 10 through the spin coating method instead of supplying the vapor of the solution 22 to the surface 10a of the substrate 10. In the spin coating method, the solution 22 was dropped onto the center of the surface 10a as the top surface of the substrate 10, while rotating the substrate 10 at 50 rpm. The temperature of the substrate 10 was 27 degrees C.

(Evaluation 1)

FIG. 11 shows data obtained by measuring the surface states of the first regions A1 immediately before the formation of AlO films, with an X-ray photoelectron spectroscopy (XPS) device, for Example 1 and Comparative Example 1. As is clear from FIG. 11, it may be seen that, according to Example 1, an intensity of peak of sulfur (S), which is a constituent element of the SAM 20, is greater and a surface density of the SAM 20 is greater than those in Comparative Example 1.

FIG. 12 shows data obtained by measuring the surface states of the first regions A1 immediately after the formation of AlO films, with an X-ray photoelectron spectroscopy (XPS) device, for Example 1 and Comparative Example 1. As is clear from FIG. 12, it may be seen that, according to Example 1, a relative strength of a peak of Cu to a peak of Al is greater than that in Comparative Example 1, such that the film formation of the AlO film may be inhibited.

From FIGS. 11 and 12, it may be seen that, when the vapor 23 of the solution 22 is supplied to the surface 10a of the substrate 10, blocking performance of the SAM 20 may be improved, when compared with when the solution 22 is applied to the surface 10a of the substrate 10 through the spin coating method. This is because, since the substrate 10 is exposed to the vapor 23 while being heated, a reaction between $CH_3(CH_2)_5SH$ and Cu proceeds at the same time as the exposure and a bond of $CH_3(CH_2)_5S$—Cu proceeds, such that a strong bond is obtained.

Examples 2 to 4

In Examples 2 to 4, a relationship between the number of carbon atoms in a main chain of a thiol-based compound and the blocking performance of SAM was investigated.

Example 2

First, in S1 of FIG. 1, as the substrate 10, a substrate including, on the surface 10a thereof, a first region A1 in which Cu is exposed and a second region A2 in which $SiO_2$ is exposed was provided. As a preprocess for the selective film formation of a SAM 20, the surface 10a of the substrate 10 was cleaned with an aqueous solution of formic acid at 25 degrees C. for 5 minutes. In addition, as the solution 22, a solution containing 1% by volume of $CH_3(CH_2)_5SH$ as the raw material 21 and 99% by volume of toluene as the solvent was provided.

Next, in S21 of FIG. 2, both the substrate 10 and the solution 22 were accommodated inside the container, and the substrate 10 was disposed above the liquid level of the solution 22. In that state, the entire container was uniformly heated from an exterior thereof with the heaters. The heating temperature was 85 degrees C., and the heating time was 5 minutes (300 seconds). As a result, the vapor 23 of the solution 22 was supplied to the surface 10a of the substrate 10.

Next, in S22 of FIG. 2, the substrate 10 was cleaned with toluene at 65 degrees C., and the raw material 21 deposited on the surface 10a of the substrate 10 and unreacted on the surface 10a was removed. Thereafter, when the surface 10a of the substrate 10 was observed with the scanning electron microscope (SEM), it was confirmed that the SAM 20 was selectively formed in the first region A1.

Example 3

In Example 3, a film formation process of a SAM 20 was executed in the same manner as in Example 2, except that, as the solution 22, a solution containing 1% by volume of $CH_3(CH_2)_{17}SH$ as the raw material 21 and 99% by volume of toluene as the solvent was provided. Thereafter, when the surface 10a of the substrate 10 was observed with the scanning electron microscope (SEM), it was confirmed that the SAM 20 was selectively formed in the first region A1.

Example 4

In Example 4, a film formation process of a SAM 20 was executed in the same manner as in Example 2, except that, as the solution 22, a solution containing 1% by volume of $CF_3(CF_2)_7(CH_2)_2SH$ as the raw material 21 and 99% by volume of toluene as the solvent was provided. Thereafter, when the surface 10a of the substrate 10 was observed with the scanning electron microscope (SEM), it was confirmed that the SAM 20 was selectively formed in the first region A1.

(Evaluation 2)

FIG. 13 shows data obtained by measuring the surface states of the first regions A1 immediately after the formation of SAM films, with an X-ray photoelectron spectroscopy (XPS) device, for Examples 2 to 4. As is clear from FIG. 11, it may be seen that, according to Example 2, an intensity of a peak of sulfur (S), which is a constituent element of the SAM 20, is greater and a surface density of the SAM 20 is greater than those in Examples 3 and 4. It is presumed that this is because the raw material 21 in Example 2 has 10 or less carbon atoms in the main chain of the thiol-based compound and has a high vapor pressure, unlike the raw materials 21 in Examples 3 to 4. As the vapor pressure becomes higher, a supply amount of the vapor increases.

FIG. 14 shows data obtained by measuring the surface states of the second regions A2 immediately after the formation of SAM films, with the X-ray photoelectron spectroscopy (XPS) device, for Examples 2 to 4. As is clear from FIG. 14, in any of Examples 2 to 4, no peak of sulfur (S), which is a constituent element of SAM 20, was observed in the second region A2.

From FIGS. 13 and 14, it may be seen that, when the vapor 23 of the solution 22 is supplied to the surface 10a of the substrate 10, the SAM 20 may be selectively formed in the first region A1. Therefore, it may be seen that it is possible to improve the surface density of the SAM 20 when the number of carbon atoms in the main chain of the thiol-based compound is 10 or less. When it is possible to improve the surface density of the SAM 20, it is also possible to improve the blocking performance of the SAM 20.

Examples 5 to 7 and Comparative Examples 2 to 7

In Examples 5 to 7, the vapor of the solution 22 was supplied to the surfaces 10a of the substrates 10, whereas, in Comparative Examples 2 to 7, the solution 22 was applied to the surface 10a of the substrate 10 through a dip coating method. The details will be described below.

Example 5

First, in S1 of FIG. 1, as the substrate 10, a substrate including, on the surface 10a thereof, a first region A1 in which Cu is exposed and a second region A2 in which SiOC is exposed was provided. As a preprocess for the selective film formation of the SAM 20, the surface 10a of the substrate 10 was cleaned with an aqueous solution of hydrogen peroxide at 60 degrees C. for 5 minutes. In addition, as the solution 22, a solution containing 1% by volume of $CH_3(CH_2)_5SH$ as the raw material 21 and 99% by volume of toluene as the solvent was provided.

Next, in S21 of FIG. 2, both the substrate 10 and the solution 22 were accommodated inside the container, and the substrate 10 was disposed above the liquid level of the solution 22. In that state, the entire container was uniformly heated from an exterior thereof with the heaters. The heating temperature was 85 degrees C., and the heating time was 5 minutes (300 seconds). As a result, the vapor 23 of the solution 22 was supplied to the surface 10a of the substrate 10.

Next, in S22 of FIG. 2, the substrate 10 was cleaned with toluene at 65 degrees C., and the raw material 21 deposited on the surface 10a of the substrate 10 and unreacted on the surface 10a was removed. Thereafter, when the surface 10a of the substrate 10 was observed with the scanning electron microscope (SEM), it was confirmed that the SAM 20 was selectively formed in the first region A1.

Finally, in S3 of FIG. 1, an AlO film was deposited on the surface 10a of the substrate 10 through the ALD method. Specifically, while the substrate 10 was accommodated inside the processing container 310 illustrated in FIG. 7, the air pressure inside the processing container 310 was controlled to 400 Pa, and the temperature of the substrate 10 was controlled to 120 degrees C., alternately supplying TMA gas and water vapor to the surface 10a of the substrate 10 was repeated 40 times. Thereafter, when the surface 10a of the substrate 10 was observed with the scanning electron microscope (SEM), it was confirmed that an AlO film was selectively formed in the second region A2. A thickness of the AlO film was 3 nm.

In Example 5, a film formation process of a HfO film instead of the AlO film was also executed. Specifically, while the substrate 10 was accommodated inside the processing container 310 illustrated in FIG. 7, the air pressure inside the processing container 310 was controlled to 400 Pa, and the temperature of the substrate 10 was controlled to 150 degrees C., alternately supplying TDMAH gas and water vapor to the surface 10a of the substrate 10 was repeated 16 times. Thereafter, when the surface 10a of the substrate 10 was observed with the scanning electron microscope (SEM), it was confirmed that a HfO film was selectively formed in the second region A2. A thickness of the HfO film was 3 nm.

In Example 5, a film formation process of a VN film instead of the AlO film was also executed. Specifically, while the substrate 10 was accommodated inside the processing container 310 illustrated in FIG. 7, the air pressure inside the processing container 310 was controlled to 133 Pa, and the temperature of the substrate 10 was controlled to 200 degrees C., alternately supplying tetrakis(ethylmethylamino)vanadium $(V[(CH_3)C_2H_5]_4)$ gas and ammonia gas to the surface 10a of the substrate 10 was repeated 13 times. Thereafter, when the surface 10a of the substrate 10 was observed with the scanning electron microscope (SEM), it was confirmed that a VN film was selectively formed in the second region A2. A thickness of the VN film was 3.5 nm.

Example 6

In Example 6, a film formation process of a SAM 20 and a film formation process of an AlO film were executed in the same manner as in Example 5, except that an aqueous solution of formic acid was used as the cleaning liquid for the preprocess, and as the solution 22, a solution containing 1% by volume of $CH_3(CH_2)_{17}SH$ and 99% by volume of toluene as the solvent was provided. In addition, a film formation process of a HfO film instead of the AlO film was also executed.

Example 7

In Example 7, a film formation process of a SAM 20 and a film formation process of an AlO film were executed in the same manner as in Example 5, except that, as the solution 22, a solution containing 1% by volume of $CF_3(CF_2)_7(CH_2)_2SH$ as the raw material 21 and 99% by volume of toluene as the solvent was provided. In addition, a film formation process of a HfO film instead of the AlO film was also executed.

Comparative Example 2

In Comparative Example 2, a film formation process of a SAM 20 and a film formation process of an AlO film were executed in the same manner as Example 5, except that the solution 22 was applied to the surface 10a of the substrate 10 through the dip coating method instead of supplying the vapor of the solution 22 to the surface 10a of the substrate 10. In the dip coating method, the entire substrate 10 was immersed in the solution 22 at 85 degrees C. for 30 minutes. In addition, a film formation process of a HfO film instead of the AlO film was also executed. Furthermore, a film formation process of a VN film instead of the AlO film was also executed.

Comparative Example 3

In Comparative Example 3, a film formation process of a SAM 20 and a film formation process of an AlO film were executed in the same manner as in Comparative Example 2, except that an aqueous solution of formic acid was used as the cleaning liquid for the preprocess. In addition, a film formation process of a HfO film instead of the AlO film was also executed. Furthermore, a film formation process of a VN film instead of the AlO film was also executed.

Comparative Example 4

In Comparative Example 4, a film formation process of a SAM 20 and a film formation process of an AlO film were executed in the same manner as in Comparative Example 2, except that an isopropyl alcohol (IPA) was used as the cleaning liquid for a preprocess, and as the solution 22, a solution containing 1% by volume of $CH_3(CH_2)_{17}SH$ and 99% by volume of toluene as the solvent was provided. In addition, a film formation process of a HfO film instead of the AlO film was also executed. Furthermore, a film formation process of a VN film instead of the AlO film was also executed.

Comparative Example 5

In Comparative Example 5, a film formation process of a SAM 20 and a film formation process of an AlO film were executed in the same manner as in Comparative Example 4, except that, as the solution 22, a solution containing 1% by volume of $CF_3(CF_2)_7(CH_2)_2SH$ as the raw material 21 and 99% by volume of toluene as the solvent was provided. In addition, a film formation process of a HfO film instead of the AlO film was also executed. Furthermore, a film formation process of a VN film instead of the AlO film was also executed.

Comparative Example 6

In Comparative Example 6, a film formation process of a SAM 20 and a film formation process of an AlO film were executed in the same manner as in Comparative Example 5, except that an aqueous solution of hydrogen peroxide was used as the cleaning liquid for the preprocess. In addition, a film formation process of a HfO film instead of the AlO film was also executed. Furthermore, a film formation process of a VN film instead of the AlO film was also executed.

Comparative Example 7

In Comparative Example 7, a film formation process of a SAM 20 film and a film formation process of an AlO film were executed in the same manner as in Comparative Example 2, except that the temperature of the substrate 10 at the time of dip coating was set to 20 degrees C. and the immersion time was set to 24 hours. In addition, a film formation process of a HfO film instead of the AlO film was also executed.

(Evaluation 3)

Table 1 shows experimental conditions and experimental results of Examples 5 to 7 and Comparative Examples 2 to 7.

TABLE 1

| | Preprocess | | | Supply of solution | | | | XPS (cps) | | |
|---|---|---|---|---|---|---|---|---|---|---|
| | | Substrate | | | | Substrate | | | | |
| | Cleaning Liquid | Temperature (degrees C.) | Time (minutes) | Raw Material | Supply Form | Temperature (degrees C.) | Time (minutes) | Al 2s | Hf 4f | V 2p |
| Example 5 | $H_2O_2$ | 60 | 5 | T1 | | | | 0 | 0 | 0 |
| Example 6 | HCOOH | 60 | 5 | T2 | Vapor | 85 | 5 | 1,400 | 0 | — |
| Example 7 | $H_2O_2$ | 60 | 5 | T3 | | | | 150 | 0 | — |
| Comparative Example 2 | $H_2O_2$ | 60 | 5 | T1 | | | | 2,000 | 50 | 0 |
| Comparative Example 3 | HCOOH | 60 | 5 | T1 | | | | 200 | 100 | 0 |
| Comparative Example 4 | IPA | 65 | 30 | T2 | Solution | 85 | 30 | 1,000 | 0 | 0 |
| Comparative Example 5 | IPA | 65 | 30 | T3 | | | | 700 | 0 | 0 |

TABLE 1-continued

| | Preprocess | | | Supply of solution | | | | XPS (cps) | | |
|---|---|---|---|---|---|---|---|---|---|---|
| | Substrate | | | | | Substrate | | | | |
| | Cleaning Liquid | Temperature (degrees C.) | Time (minutes) | Raw Material | Supply Form | Temperature (degrees C.) | Time (minutes) | Al 2s | Hf 4f | V 2p |
| Comparative Example 6 | $H_2O_2$ | 60 | 5 | T3 | | | | 450 | 0 | 0 |
| Comparative Example 7 | $H_2O_2$ | 60 | 5 | T1 | | 20 | 1440 | 300 | 0 | 0 |

In Table 1, "T1" indicates $CH_3(CH_2)_5SH$, "T2" indicates $CH_3(CH_2)_{17}SH$, and "T3" indicates $CF_3(CF_2)_7(CH_2)_2SH$. In addition, in Table 1, the number of photoelectrons of Al2s indicates the surface state of the first region A1 immediately after the film formation of the AlO film, and the number of photoelectrons of Hf4f indicates the surface state of the first region A1 immediately after the film formation of the HfO film, the number of photoelectrons of V2p indicates the surface state of the first region A1 immediately after the film formation of the VN film. Since the first region A1 is a region in which the SAM 20 is formed, as the number of photoelectrons such as Al2s becomes smaller, the blocking performance of the SAM 20 becomes greater.

In Table 1, for example, as is clear from comparing Example 5 and Comparative Example 2, it may be seen that, when the vapor of the solution 22 is supplied to the surface 10a of a substrate 10 instead of applying the solution 22 to the surface 10a of the substrate 10 through the dip coating method, the blocking performance of the SAM 20 may be improved. This effect is particularly remarkable when the AlO film is formed. A similar tendency may be seen by comparing Example 7 and Comparative Example 6.

In Table 1, for example, as is clear from comparing Example 5 and Comparative Example 7, it may be seen that, when the vapor of the solution 22 is supplied to the surface 10a of the substrate 10 instead of applying the solution 22 to the surface 10a of the substrate 10 through the dip coating method, a sufficient blocking performance may be obtained within a short time.

Although the embodiments of the film formation method and the film formation apparatus according to the present disclosure have been described above, the present disclosure is not limited to the above-described embodiments or the like. Various changes, modifications, replacements, additions, deletions, and combinations may be made within the scope of the claims. Those also fall within the technical scope of the present disclosure.

The present disclosure claims priority based on Japanese Patent Application No. 2019-239349 filed with the Japan Patent Office on Dec. 27, 2019, and the disclosure of Japanese Patent Application No. 2019-239349 is incorporated herein in its entirety by reference.

EXPLANATION OF REFERENCE NUMERALS

10: substrate, 10a: surface, A1: first region, A2: second region, 20: self-assembled monolayer (SAM), 21: raw material, 22: solution, 23: vapor, 30: target film

What is claimed is:

1. A film formation method comprising:
    providing a substrate including, on a surface of the substrate, a first region in which a first material is exposed and a second region in which a second material different from the first material is exposed;
    supplying, to the surface of the substrate, vapor of a solution that contains a raw material of a self-assembled monolayer and a solvent by which the raw material is dissolved, and selectively forming the self-assembled monolayer in the first region; and
    forming a target film in the second region by using the self-assembled monolayer formed in the first region,
    wherein the selectively forming the self-assembled monolayer in the first region includes supplying the vapor of the solution to the surface of the substrate to deposit the raw material on the surface, and removing the raw material deposited on the surface and unreacted raw material on the surface, and
    wherein the removing the raw material deposited on the surface and unreacted raw material on the surface includes supplying, to the surface, the solvent that is heated to a temperature within a range of 65 degrees C. to 85 degrees C.

2. The film formation method of claim 1, wherein the supplying the vapor of the solution to the surface of the substrate includes controlling a temperature of the substrate to be higher than a temperature of the solution.

3. The film formation method of claim 2, wherein the supplying the vapor of the solution to the surface of the substrate includes controlling a temperature of a portion of an inner wall surface of a first processing container that is in contact with the vapor to be higher than the temperature of the solution, the first processing container accommodating the substrate.

4. The film formation method of claim 3, wherein the supplying the vapor of the solution to the surface of the substrate includes generating the vapor inside a second processing container accommodating the solution and sending the generated vapor from the second processing container to the first processing container accommodating the substrate.

5. The film formation method of claim 4, wherein the generating the vapor of the solution includes bubbling the solution inside the second processing container.

6. The film formation method of claim 5, wherein the solvent contained in the solution has a boiling point of 40 degrees C. to 120 degrees C.

7. The film formation method of claim 6, wherein a time duration during which the vapor of the solution is supplied to the surface of the substrate is 60 seconds to 300 seconds.

8. The film formation method of claim 1, wherein the first material in the first region is a metal or a semiconductor,
    wherein the second material in the second region is an insulating material, and
    wherein the raw material of the self-assembled monolayer is a thiol-based compound.

9. The film formation method of claim 1, wherein the supplying the vapor of the solution to the surface of the substrate includes controlling a temperature of a portion of an inner wall surface of a first processing container that is in contact with the vapor to be higher than a temperature of the solution, the first processing container accommodating the substrate.

10. The film formation method of claim 1, wherein the substrate is accommodated in a first processing container, and
wherein the supplying the vapor of the solution to the surface of the substrate includes generating the vapor inside a second processing container accommodating the solution and sending the generated vapor from the second processing container to the first processing container.

11. The film formation method of claim 10, wherein the generating the vapor of the solution includes bubbling the solution inside the second processing container.

12. The film formation method of claim 1, wherein the solvent contained in the solution has a boiling point of 40 degrees C. to 120 degrees C.

13. The film formation method of claim 1, wherein a time duration during which the vapor of the solution is supplied to the surface of the substrate is 60 seconds to 300 seconds.

14. The film formation method of claim 1, wherein the first material in the first region is a metal or a semiconductor,
wherein the second material in the second region is an insulating material, and
wherein the raw material of the self-assembled monolayer is a thiol-based compound.

15. The film formation method of claim 1, wherein the first material in the first region is an insulating material,
wherein the second material in the second region is a metal or a semiconductor, and
wherein the raw material of the self-assembled monolayer is a silane-based compound.

16. A film formation apparatus for forming a target film on a substrate including, on a surface of the substrate, a first region in which a first material is exposed and a second region in which a second material different from the first material is exposed, the film formation apparatus comprising:
a first processor configured to supply, to the surface of the substrate, vapor of a solution that contains a raw material of a self-assembled monolayer and a solvent by which the raw material is dissolved, and selectively form the self-assembled monolayer in the first region;
a second processor configured to form the target film in the second region by using the self-assembled monolayer formed by the first processor;
a transporter configured to transport the substrate with respect to the first processor and the second processor; and
a controller configured to control the first processor, the second processor, and the transporter,
wherein the first processor includes a processing container configured to accommodate the solution and a nozzle configured to supply the solvent to the surface of the substrate, and
wherein the controller is configured to control the first processor so as to supply the vapor of the solution to the surface of the substrate to deposit the raw material on the surface, and remove the raw material deposited on the surface and unreacted raw material on the surface by using the solvent that is heated to a temperature within a range of 65 degrees C. to 85 degrees C. in the processing container.

* * * * *